(12) United States Patent
Inoue et al.

(10) Patent No.: US 6,279,814 B1
(45) Date of Patent: Aug. 28, 2001

(54) SOLDERING APPARATUS FOR PROVIDING A FIXED QUANTITY OF SOLDER PIECE ONTO TARGET PLATE

(75) Inventors: Akifumi Inoue; Koshiro Takeda, both of Shizuoka (JP)

(73) Assignee: Yamaha Corporation, Tokyo (JP)

( * ) Notice: Subject to any disclaimer, the term of this patent is extended or adjusted under 35 U.S.C. 154(b) by 0 days.

(21) Appl. No.: 09/339,339

(22) Filed: Jun. 23, 1999

Related U.S. Application Data

(62) Division of application No. 08/795,891, filed on Feb. 5, 1997, now Pat. No. 5,954,262.

(30) Foreign Application Priority Data

Feb. 9, 1996 (JP) .................................................. 8-024383

(51) Int. Cl.[7] .................................................. B23K 31/02
(52) U.S. Cl. .................................. 228/180.21; 228/180.1; 228/179.1; 228/178
(58) Field of Search .......................... 228/180.21, 180.1, 228/179.1, 178, 253, 244; 219/388, 385

(56) References Cited

U.S. PATENT DOCUMENTS 5,433,368 * 7/1995 Spigarelli .................................. 228/8
5,573,170 * 11/1996 Sasaki et al. .......................... 228/14

* cited by examiner

*Primary Examiner*—M. Alexandra Elve
(74) *Attorney, Agent, or Firm*—Ostrolenk, Faber, Gerb & Soffen, LLP

(57) ABSTRACT

A punching pin of a soldering apparatus cuts out a solder piece from a solder plate onto a feeder pin, and the feeder pin presses the solder piece against a predetermined junction of a conductive wiring pattern incorporated in a printed circuit board; then, an electric circuit component is mounted on the printed circuit board, and is strongly soldered to the conductive wiring pattern, because the punching pin and the feeder pin supply a fixed amount of solder to the predetermined junction.

4 Claims, 8 Drawing Sheets

SOLDERING APPARATUS FOR PROVIDING A FIXED QUANTITY OF SOLDER PIECE ONTO TARGET PLATE

This is a division of application Ser. No. 08/795,891, filed Feb. 5, 1997, and now U.S. Pat. No. 5,954,262.

FIELD OF THE INVENTION

This invention relates to a semiconductor assembly technology and, more particularly, to a soldering apparatus for providing a fixed quantity of solder piece to a printed circuit board and a method of soldering a circuit component to the printed circuit board.

DESCRIPTION OF THE RELATED ART

A module is a basic component unit of an electric system, and electric circuit components are assembled on a rigid or flexible board during a fabrication of the module. Bare chips are, by way of example, mounted on a printed circuit board, and a flexible board may be assembled with a rigid board. Thus, a micro-connecting technology is an important factor of the fabrication of the module.

A typical example of the micro-connecting technology is known as a solder printing. The solder printing process has the following sequence. First, the manufacturer prepares a printed circuit board, a solder paste and a mask. A conductive wiring pattern is printed on the printed circuit board, and solder powder and binder form the solder paste. The mask has through-holes, and is aligned with the printed circuit board. Junctions of the conductive wiring pattern are exposed to the through-holes of the mask, and the solder paste is screen printed through the mask on the printed circuit board. Finally, bare chips are mounted on the printed circuit board, and the pins of the bare chips are soldered to the junctions of the conductive wiring pattern by applying heat to the solder.

Although the screen-printing exactly locates the solder paste on the junctions, the amount of solder paste is not constant. In particular there is a tendency to scale down the module, and the junctions of the conductive wiring pattern are arranged to be close to one another. In this situation, the through-holes of the mask are miniaturized, and the miniature through-holes do not allow the solder paste to smoothly pass therethrough. This results in the fluctuation of the amount of solder paste on the junctions, and an electric circuit component is liable to be disconnected from the printed circuit board due to shortage of the solder.

SUMMARY OF THE INVENTION

It is therefore an important object of the present invention to provide a soldering apparatus which strongly fixes a component element to a target plate with a fixed amount of solder.

It is also an important object of the present invention to provide a method of strongly soldering a component element to a target plate with a fixed amount of solder.

To accomplish the object, the present invention proposes to cut out a piece of solder from a solder sheet onto a feeder which moves the piece of solder to a junction.

In accordance with one aspect of the present invention, there is provided a soldering apparatus comprising a solder piece provider for supplying at least one solder piece on a target layer, the solder piece provider comprising a die unit having at least one through-hole, a conveying mechanism selectively supplying a solder plate and a target layer in such a manner that the die unit is overlapped with one of the solder plate and the target plate, a punching mechanism moving a punching pin into and out of the through-hole so as to cut out a solder piece from the solder plate so as to leave the solder piece in the through hole, and a feeding mechanism moving a feeder pin in the through-hole so as to press the solder piece against the target layer.

In accordance with another aspect of the present invention, there is provided a micro-connecting method comprising the steps of: a) providing a solder plate on a die unit having at least one through-hole; b) pressing a punching pin against the solder plate so as to cut out a solder piece from the solder plate, the solder piece being left in the through-hole; c) removing the solder plate from the die unit; d) aligning a junction point of a target layer with the through-hole; e) moving a feeder pin in the through-hole so as to press the solder piece against the junction point; and f) soldering a component element to the junction by using the solder piece.

BRIEF DESCRIPTION OF THE DRAWINGS

The features and advantages of the soldering apparatus according to the present invention will be more clearly understood from the following description taken in conjunction with the accompanying drawings in which.

DESCRIPTION OF THE PREFERRED EMBODIMENTS

First Embodiment

Figure 1:
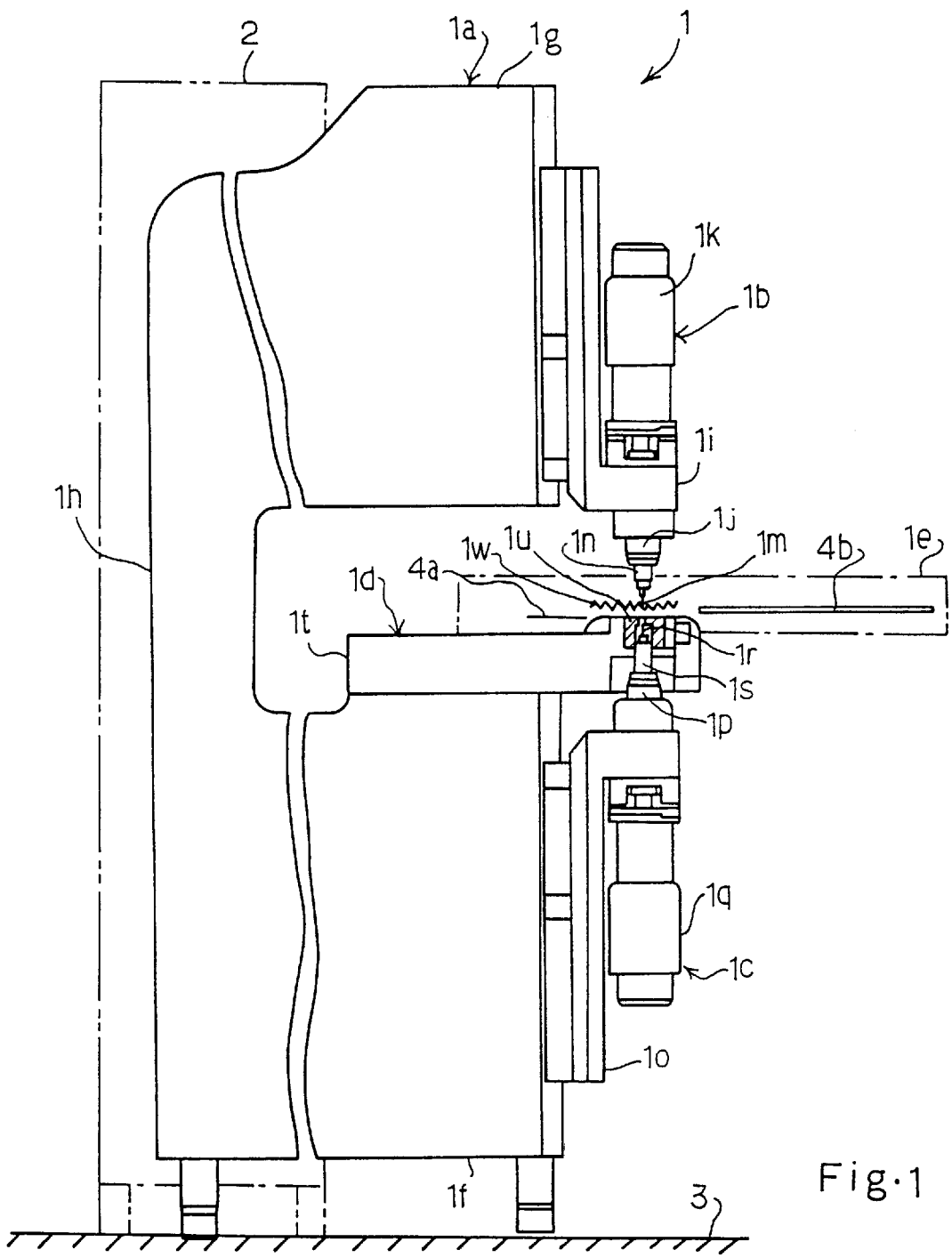
FIG. 1 is a side view showing the structure of a soldering apparatus according to the present invention.

Referring first to FIG. 1 of the drawings, a soldering apparatus embodying the present invention largely comprises a solder piece provider 1 and a mounter 2. The solder piece provider 1 supplies solder pieces onto junctions of a conductive wiring pattern on a printed circuit board, and the mounter 2 fixes an electric circuit component to the junctions by applying heat.

The solder piece provider 1 largely comprises a frame structure 1a, a punching mechanism 1b, a feeding mechanism 1c, a die 1d, a conveying mechanism 1e and a controller (not shown). These are detailed hereinbelow.

The frame structure 1a includes a lower portion 1f placed on a floor 3, an upper portion 1g over the lower portion 1f and a connecting portion 1h connecting the upper portion 1g to the lower portion 1f. The connecting portion 1h spaces the upper portion 1g from the lower portion 1f, and a gap is disposed between the lower portion 1f and the upper portion 1g. The controller may be housed in the frame structure 1a so as to control the punching mechanism 1b, the feeding mechanism 1c and the conveying mechanism The punching mechanism 1b includes a frame 1i, a rod member 1j, an actuator 1k, a punching pin 1m, and a suitable chuck 1n. The frame 1i is fixed to the front surface of the upper portion 1g, and the rod member 1j is slidably supported by the frame 1i. The actuator 1k is mounted on the frame 1i, and is connected to the rod member 1j. The rod member 1j is directed in the up-and-down direction, and the actuator 1k reciprocally drives the rod member 1j at high speed. The chuck 1n is attached to the lower end of the rod member 1*j*, and the punching pin 1*m* is fixed to the rod member 1*j* by means of the chuck 1*n*. Therefore, the punching pin 1*m* is also reciprocally driven in the up-and-down direction. The punching pin 1*m* is formed of cemented carbide, and the diameter of the punching pin 1*m* ranges from 50 microns to 100 microns. A manufacturer stores a plurality of punching pins 1*m*, and replaces the punching pin 1*m* with a new punching pin different in diameter depending upon the amount of solder piece to be requested.

The feeding mechanism 1*c* includes a frame 1*o*, a rod 1*p*, an actuator 1*q*, a feeder pin 1*r* and a chuck 1*s*. The frame 1*o* is fixed to the front surface of the lower portion 1*f*, and the rod member 1*p* is slidably supported by the frame 1*o*. The actuator 1*q* is mounted on the frame 1*o*, and is connected to the rod member 1*p*. The rod member 1*p* is directed in the up-and-down direction, and the actuator 1*q* reciprocally drives the rod member 1*p*. The chuck 1*s* is attached to the upper end of the rod member 1*p*, and the feeder pin 1*r* is fixed to the rod member 1*p* by means of the chuck 1*s* in such a manner that the feeder pin 1*r* is aligned with the punching pin 1*m*. The feeder pin 1*r* is also reciprocally driven in the up-and-down direction. However, the feeder pin 1*r* is moved slower than the punching pin 1*m*. However, the feeder pin 1*r* presses a solder piece against a rigid board, and large thrust is exerted on the feeder pin 1*r* in the direction of the center line thereof. For this reason, the feeder pin 1*r* is formed of material which can well withstand the large thrust force. The diameter of the punching pin 1*m* also ranges from 50 microns to 100 microns, and the manufacturer replaces the feeder pin 1*r* with a new feeder pin different in diameter depending upon the amount of solder piece to be requested.

The die 1*d* is mounted on the upper surface of the lower portion 1*f*, and includes a die holder 1*t* and a die unit 1*u*. The die holder 1*t* is fixed to the lower portion 1*f*, and maintains the die 1*u* between the punching mechanism 1*b* and the feeding mechanism 1*c*. The die 1*u* has a through-hole 1*v* (see FIGS. 2A to 2F), and the through-hole 1*v* is aligned with not only the punching pin 1*m* but also the feeder pin 1*r*. The die holder 1*t* maintains the die 1*u* to have the through-hole 1*v* exactly perpendicular to the trajectories of the punching/feeder pins 1*m*/1*r*, and the diameter of the through-hole 1*v* is slightly larger than the diameter of the punching pin 1*m* and the diameter of the feeder pin 1*r*. The manufacturer stores a plurality of die units 1*u* different in the diameter of the through-hole 1*v*, and replaces the die unit 1*u* depending upon the punching pin 1*m* and the feeder pin 1*r*.

When the punching pin 1*m* reaches the lower dead point, the leading end portion of the punching pin 1*m* is inserted into the through-hole 1*v*. On the other hand, while the feeder pin 1*r* is resting at the lower dead point, the leading end of the feeder pin 1*r* is in the through-hole. The actuator 1*q* upwardly pushes up the rod member 1*s*, and the leading end of the feeder pin 1*r* projects from the through-hole 1*v*.

The conveying mechanism 1*e* selectively conveys a solder plate 4*a* and a printed circuit board 4*b* over the die unit 1*u*, and aligns a junction 4*c* of a conductive wiring pattern 4*d* (see FIGS. 2D to 2F) with the through-hole 4*v*. Therefore, the conveying mechanism 1*e* not only selectively moves the solder plate 4*a* and the printed circuit board 4*b* over the die unit 1*u* but also regulates the solder plate 4*a* and the printed circuit board 4*b* to a target position through a two-dimensional motion. The solder plate 4*a* ranges from 30 microns to 60 microns in thickness.

A heater 1*w* is incorporated in the conveying mechanism 1*e*, and the heater 1*w* heats the printed circuit board to a certain temperature at which a solder piece is fusion bonded thereto.

Description is made on a micro-connecting method with reference to FIGS. 2A to 2G. First, the manufacturer prepares the soldering apparatus described hereinbefore and an electric circuit component 4*e* (see FIG. 2G) to be mounted on the printed circuit board 4*b*. The manufacturer provides the printed circuit board 4*b* and the solder plate 4*a* to the conveying mechanism 1*e*.

Figure 2A:
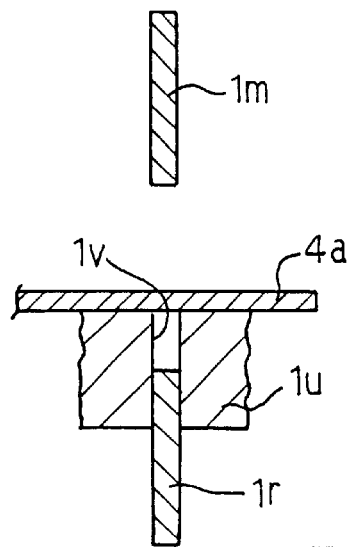
FIGS. 2A to 2G are cross sectional views showing a sequence of a micro-connecting method according to the present invention.

The conveying mechanism 1*e* firstly conveys the solder plate 4*a* to the die unit 1*u*, and the solder plate 4*a* is placed over the die unit 1*u* as shown in FIG. 2A. If a solder piece has been already cut out from the solder plate 4*a*, the conveying mechanism 1*e* places a different portion of the solder plate 4*a* on the die unit 1*u*. The feeding mechanism 1*c* maintains the feeder pin 1*r* at the lower dead point, and the leading end of the feeder pin 1*r* is retracted into the through-hole 1*v*.

Figure 2B:
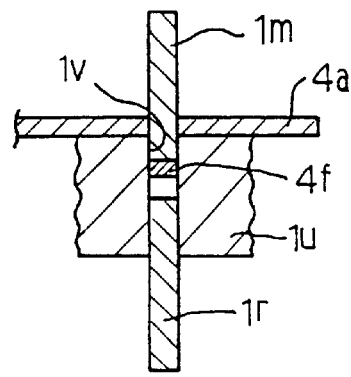

Subsequently, the actuator 1*k* downwardly moves the rod member 1*j* and, accordingly, the punching pin 1*m* at high speed. The punching pin 1*m* is brought into collision with the solder plate 4*a*, and cuts out a solder piece 4*f* as shown in FIG. 2B.

Figure 2C:
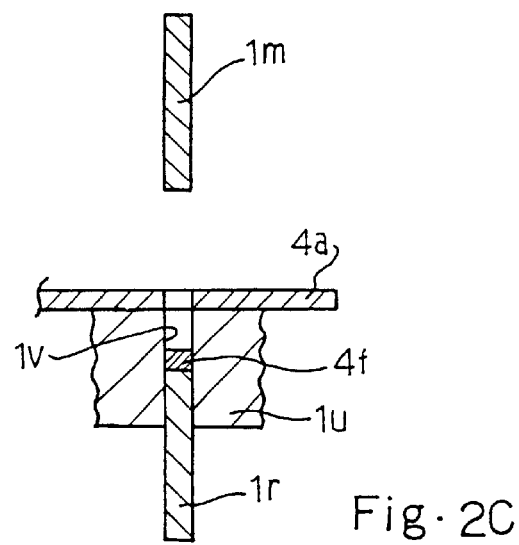

The solder piece is fallen onto the feeder pin 1*r* as shown in FIG. 2C, and the actuator 1*k* pulls up the rod member 1*j* and, accordingly, the punching pin 1*m*. As a result, the punching pin 1*m* is moved outof the die unit 1*u*. The volume of the solder piece 4*f* is determined by the thickness of the solder plate 4*a* and the diameter of the punching pin 1*m*. If the manufacturer wants to increase the volume of the solder piece 4*f*, he changes the set of punching pin 1*m*, feeder pin 1*r* and die unit 1*u* and/or the solder plate 4*a* different in thickness. In this way, the manufacturer can exactly control the amount of solder piece 4*f*.

Figure 2D:
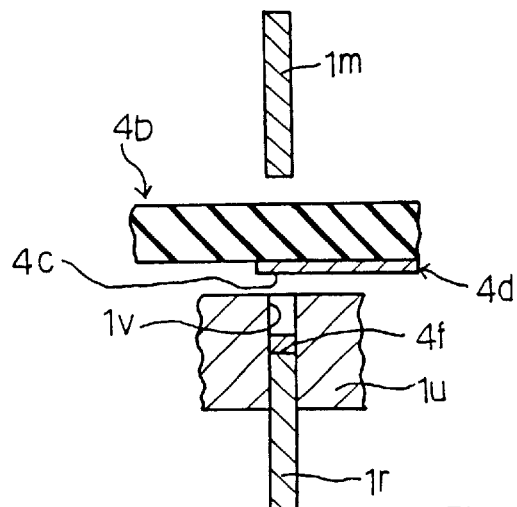

Subsequently, the conveying mechanism 1*e* removes the solder plate 4*a* from the die unit 1*u*, and conveys the printed circuit board 4*b* to the die unit 1*u*. The conveying mechanism 1*e* aligns the junction 4*c* of the conductive wiring pattern 4*d* of the printed circuit board 4*b* with the through-hole 1*v* of the die unit 1*u* as shown in FIG. 2D. The heater 1*w* heats the printed circuit board 4*b* to the certain temperature.

Figure 2E:
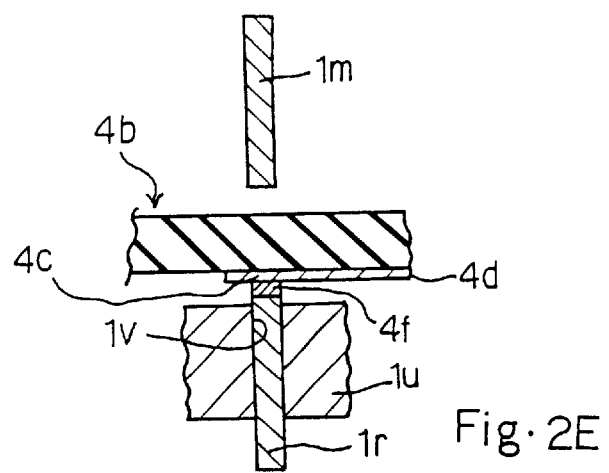

The actuator 1*q* upwardly moves the rod member 1*p* and, accordingly, the feeder pin 1*r*. The feeder pin 1*r* projects over the die unit 1*u*, and presses the solder piece 4*f* against the junction 4*c* as shown in FIG. 2E. The solder piece 4*f* is bonded to the junction 4*d* of the conductive wiring pattern 4*c*.

Figure 2F:
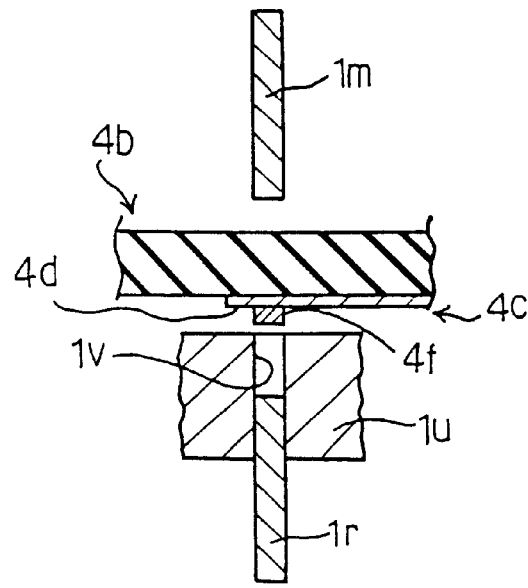

The actuator 1*q* downwardly moves the rod member 1*p* and the feeder pin 1*r*, and the feeder pin 1*r* is retracted into the through-hole 1*v*. The solder piece 4*f* is left on the junction 4*c* as shown in FIG. 2F.

The solder piece provider 1 repeats the above described steps, and a plurality of solder pieces 4*f* are bonded to the junctions 4*d* of the conductive wiring pattern 4*c*. The solder pieces 4*f* are exactly regulated to the predetermined volume.

Figure 2G:
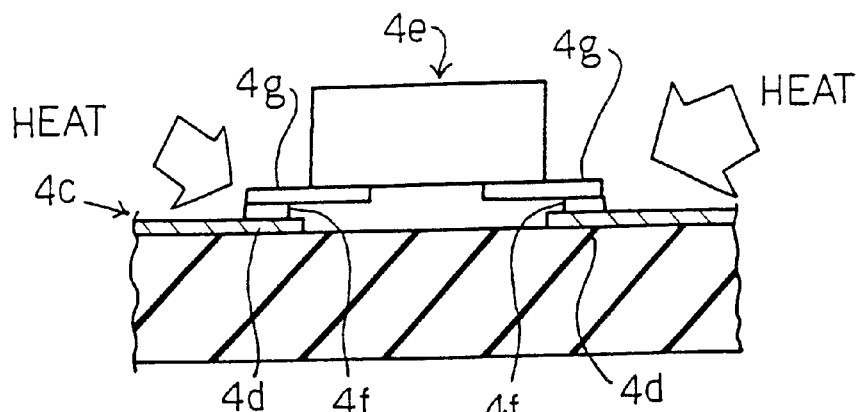

Subsequently, the printed circuit board 4*a* is conveyed to the mounter 2, and the electric circuit component 4*e* such as, for example, a bare chip is mounted on the printed circuit board 4*a* in such a manner that conductive pins 4*g* of the electric circuit component 4*e* are aligned through the solder pieces 4*f* with the junctions 4*d* of the conductive wiring pattern 4*c*. The mounter 2 applies heat to the solder pieces 4*f*, and the conductive pins 4*g* are connected to the conductive wiring pattern 4*c* as shown in FIG. 2G.

As will be appreciated from the foregoing description, the solder piece provider 2 supplies a fixed amount of solder pieces onto the conductive wiring pattern 4*c* or the target layer, and the solder pieces 4*f* strongly fix the electric circuit component 4e to the conductive wiring pattern 4c. Even if the electric circuit serves for long time period, the electric circuit component 4e is never disconnected from the conductive wiring pattern 4c due to shortage of solder.

Second Embodiment

Turning to FIGS. 3A to 3G of the drawings, another sequence of a micro-connecting method starts with preparation of a solder plate 11a and a printed circuit board 11b in a solder piece provider 10 according to the present invention. The solder piece provider 10 is different from the solder piece provider 1 in the location of the punching mechanism and the feeding mechanism and a through-hole 12a of a die unit 12b. The feeding mechanism is provided over the punching mechanism, and the through-hole 12a upwardly decreases the cross section. The other components of the solder piece provider 10 are similar to those of the solder piece provider 1, and are labeled with the references designating corresponding components of the solder piece provider 1 without detailed description.

Figure 3A:
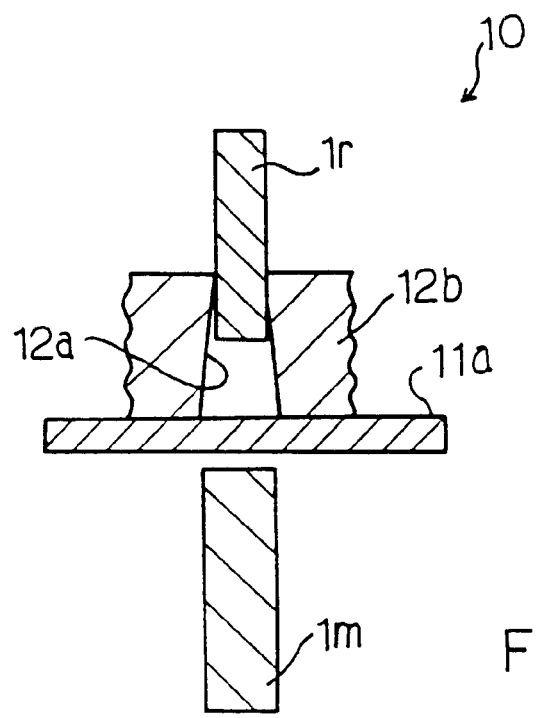
FIGS. 3A to 3G are cross sectional views showing another sequence of a micro-connecting method according to the present invention.
Figure 3B:
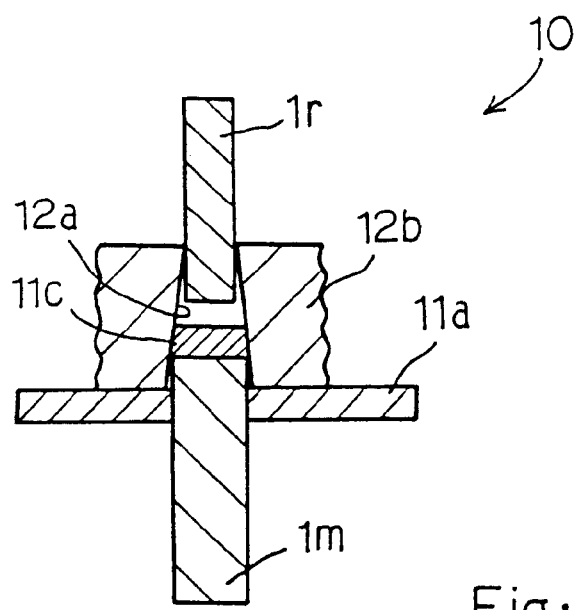

The solder plate 1a is placed under the die unit 12b as shown in FIG. 3A. Then, the punching pin 1m is upwardly moved, and the leading end of the punching pin 1m is inserted into the through-hole 12a. A solder piece 11c is cut out from the solder plate 11a (see FIG. 3B), and the through-hole 12a is clogged with the solder piece, because the through-hole 12a narrows toward the upper end.

Figure 3C:
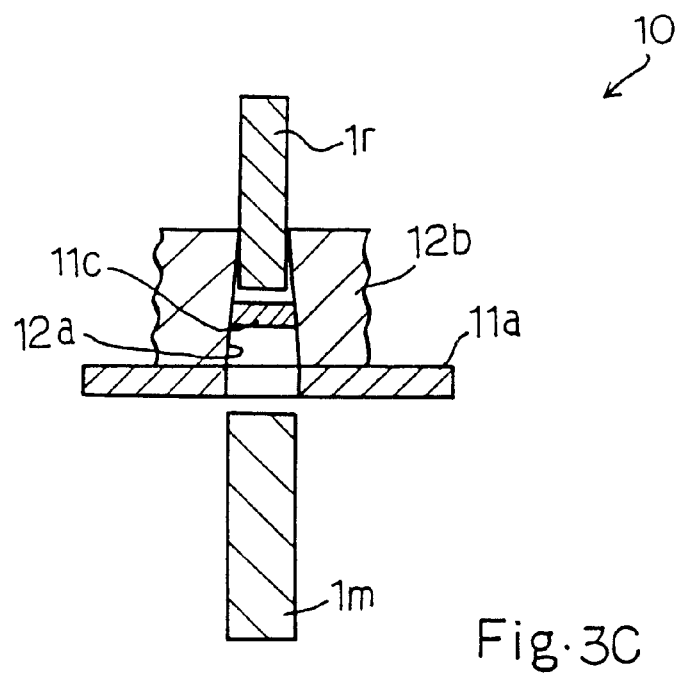
Figure 3D:
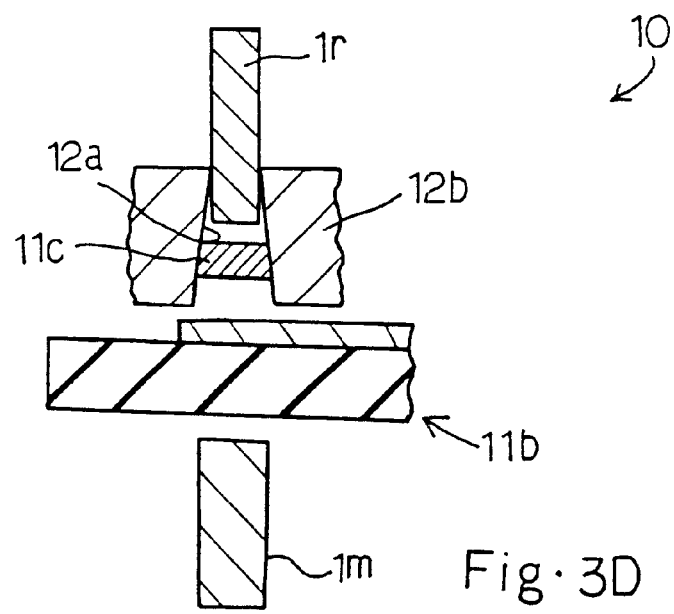

The punching pin 1m is downwardly moved, and the solder piece 11c is left in the through-hole 12a as shown in FIG. 3C. The conveying mechanism 1e removes the solder plate 11a from under the die unit 12b, and the printed circuit board 11b is placed under the die unit 12b as shown in FIG. 3D.

Figure 3E:
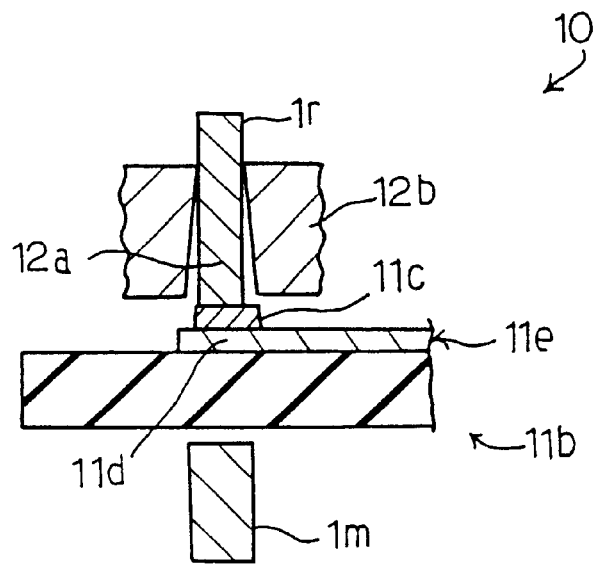

The feeder pin 1r is downwardly moved, and pushes out the solder piece 11c from the through-hole 12a. The feeder pin 1r presses the solder piece 11c against a junction 11d of a conductive wiring pattern 11e of the printed circuit board 11b. The printed circuit board 11b has been already heated to the certain temperature, and the solder piece 11c is bonded to the junction 11d of the conductive wiring pattern 11e as shown in FIG. 3E.

Figure 3F:
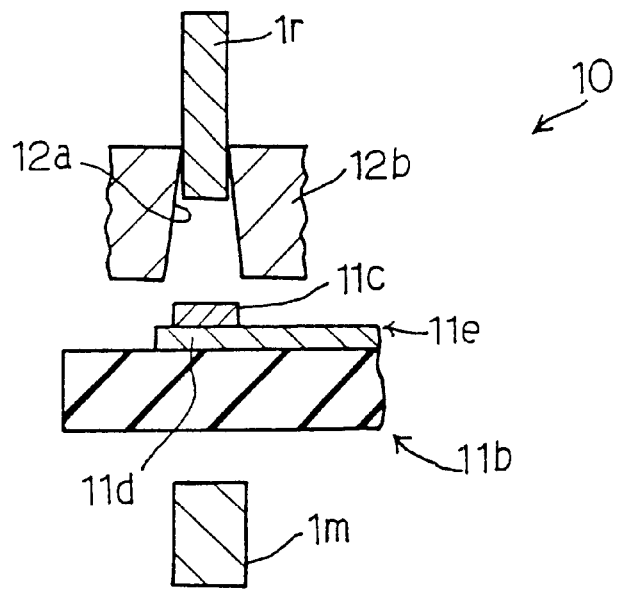
Figure 3G:
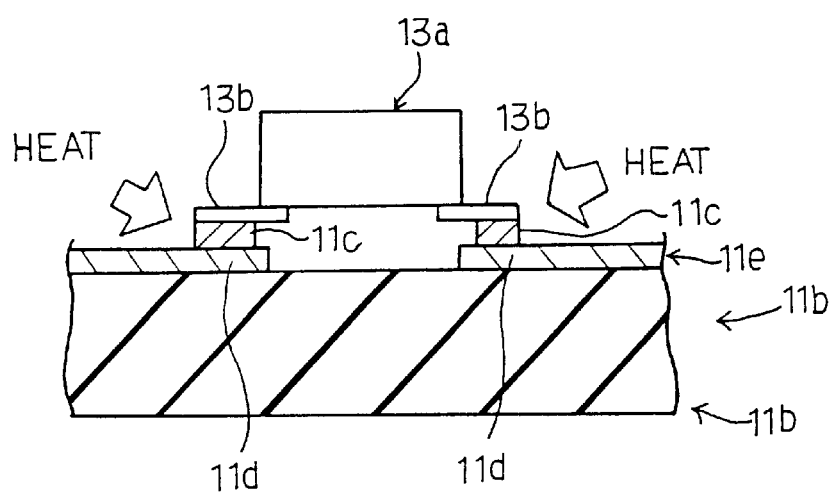

The feeder pin 1r is upwardly moved, and is retracted into the die unit 12b as shown in FIG. 3F. The printed circuit board 11b is conveyed to the mounter 2, and an electric circuit component 13a is mounted on the printed circuit board 11b, and the solder pieces 11c are overlapped with pins 13b of the electric circuit components 13a. Heat is applied to the solder pieces 11c, and the solder pieces 11c bond the pins 13b to the junctions 11d.

The second embodiment achieves all the advantages of the first embodiment.

Although particular embodiments of the present invention have been shown and described, it will be obvious to those skilled in the art that various changes and modifications may be made without departing from the spirit and scope of the present invention.

For example, a plurality of punching pins and a plurality of feeder pins may be incorporated in the punching mechanism and the feeding mechanism so as to concurrently supply solder pieces to a printed circuit board.

In the above described embodiments, the die unit 1u is stationary, and the conveying mechanism 1e two-dimensionally moves the solder plate 4a and the printed circuit board 4b so as to locate them at a target position. However, another solder piece provider according to the present invention may move the die unit 1u, the punching mechanism 1b and the feeding mechanism 1c with respect to the solder plate 4a and the printed circuit board 4b.

The solder piece provider according to the present invention may be used for a die bonding between a lead frame and a semiconductor chip or any kind of soldering for micro-components.

What is claimed is:

1. A soldering apparatus comprising a solder piece provider for supplying at least one solder piece on a target layer, said solder piece provider comprising:

a die unit having at least one through-hole, a conveying mechanism selectively supplying a solder plate and a target layer in such a manner that said die unit is overlapped with one of said solder plate and said target plate, a punching mechanism provided on one side of said die plate and having a punching pin aligned with said through-hole for moving said punching pin into and out of said through-hole, thereby cutting out a solder piece from said solder plate so as to leave said solder piece in said through-hole, and a feeding mechanism provided on the other side of said die plate and having a feeder pin aligned with said through-hole for moving said feeder pin in said through-hole so as to press said solder piece against said target layer.

2. The soldering apparatus as set forth in claim 1, in which said punching mechanism and said feeding mechanism are provided over said die unit and under said die, respectively, and said feeder pin is waiting in said through-hole when said punching pin cuts out said solder piece, thereby receiving said solder piece fallen thereonto.

3. The soldering apparatus as set forth in claim 1, in which said punching mechanism and said feeding mechanism are provided under said die unit and over said die unit, respectively, and said through-hole narrows toward the upper end thereof so as to maintain said solder piece therein after said punching pin is spaced therefrom.

4. The soldering apparatus as set forth in claim 1, further comprising a mounter bonding a component to said target layer by applying heat to said solder piece.

* * * * *